(12) United States Patent
Oh et al.

(10) Patent No.: US 8,077,448 B2
(45) Date of Patent: Dec. 13, 2011

(54) PLASMA DISPLAY APPARATUS

(75) Inventors: Jaeyoung Oh, Daegu (KR); Jung Gwan Han, Gumi-si (KR); Sam Je Cho, Anyang-si (KR)

(73) Assignee: LG Electronics Inc., Seoul (KR)

( * ) Notice: Subject to any disclaimer, the term of this patent is extended or adjusted under 35 U.S.C. 154(b) by 1226 days.

(21) Appl. No.: 11/380,584

(22) Filed: Apr. 27, 2006

(65) Prior Publication Data

US 2006/0262036 A1    Nov. 23, 2006

(30) Foreign Application Priority Data

May 19, 2005 (KR) .................. 10-2005-0042230
Sep. 20, 2005 (KR) .................. 10-2005-0087474

(51) Int. Cl.
*H05K 7/14* (2006.01)
(52) U.S. Cl. ............... 361/679.21; 361/679.22; 345/60
(58) Field of Classification Search ............ 361/679.21, 361/679.22; 248/917–924; 349/58–60; 313/582; 345/58–60
See application file for complete search history.

(56) References Cited

U.S. PATENT DOCUMENTS

| | | | | |
|---|---|---|---|---|
| 6,366,264 B1 * | 4/2002 | Kurumada | | 345/60 |
| 6,774,872 B1 * | 8/2004 | Kawada et al. | | 345/60 |
| 6,972,963 B1 * | 12/2005 | Chou | | 361/760 |
| 6,977,709 B2 * | 12/2005 | Miyamura et al. | | 349/158 |
| 7,218,521 B2 * | 5/2007 | Kim | | 361/704 |
| 7,453,207 B2 * | 11/2008 | Bae | | 313/582 |
| 7,508,673 B2 * | 3/2009 | Kim et al. | | 361/704 |
| 2004/0114063 A1 | 6/2004 | Miyamura | | |
| 2005/0068265 A1 * | 3/2005 | Joo et al. | | 345/60 |
| 2005/0088092 A1 * | 4/2005 | Kim et al. | | 313/582 |
| 2005/0259401 A1 * | 11/2005 | Han et al. | | 361/704 |

FOREIGN PATENT DOCUMENTS

| | | |
|---|---|---|
| JP | 2000-056701 | 2/2000 |
| JP | 2000-56701 | 2/2000 |
| JP | 2003-216054 A | 7/2003 |
| JP | 2004-126151 A | 4/2004 |
| JP | 20050052612 * | 6/2005 |
| KR | 10-2005-0041068 A | 5/2005 |
| KR | 10-2005-0114092 | 12/2005 |

OTHER PUBLICATIONS

European Patent Office dated Nov. 10, 2009 for Application No. 06 010 057.5, 8 pages.
Office Action issued by Chinese Patent Office for Chinese Application No. 2006100790617, dated Mar. 7, 2008, (7 pages).

* cited by examiner

*Primary Examiner* — Jayprakash N Gandhi
*Assistant Examiner* — Ingrid Wright
(74) *Attorney, Agent, or Firm* — Fish & Richardson P.C.

(57) ABSTRACT

An improved structure of a plasma display apparatus is provided. At least one of an integrated circuit and a driving board is formed over an edge potion of a frame for supporting a plasma display panel. Thus, the plasma display apparatus is manufactured to be thin and light, and also its manufacturing cost decreases.

8 Claims, 8 Drawing Sheets

PLASMA DISPLAY APPARATUS

This Nonprovisional application claims priority under 35 U.S.C. §119(a) on patent applications Nos. 10-2005-0042230 & 10-2005-0087474 filed in Korea on May 19, and Sep. 20, 2005, the entire contents of which are hereby incorporated by reference.

BACKGROUND OF THE INVENTION

1. Field of the Invention

This document relates to a plasma display apparatus, and more particularly, to a structure of a plasma display apparatus.

2. Description of the Related Art

A plasma display apparatus comprises a plasma display panel, on which an electrode is formed, and a driving board for supplying a signal to the electrode such that an image is displayed.

The plasma display panel comprises a front panel, a rear panel, and barrier ribs formed between the front panel and the rear panel. The barrier ribs form discharge cells. Each of the discharge cells is filled with an inert gas containing a main discharge gas such as neon (Ne), helium (He) or a Ne—He gas mixture and a small amount of xenon (Xe).

The driving board applies a driving signal in accordance with an image signal input from the outside to the electrode of the plasma display panel so that the plasma display panel is driven.

The driving signal generates a plasma discharge within the discharge cell. When the plasma discharge is generated, the inert gas generates vacuum ultraviolet rays and the vacuum ultraviolet rays emit a phosphor formed between the barrier ribs. Then, the phosphor emits visible light by vacuum ultraviolet rays so that the image is displayed.

The plasma display apparatus requires a connecting member for electrically connecting the plasma display panel to the driving board. The connecting member causes an increase in the manufacturing cost of the plasma display apparatus. The connecting member also hinders the plasma display apparatus from being manufactured to be thin and light.

SUMMARY OF THE INVENTION

Accordingly, an object of the present invention is to solve at least the problems and disadvantages of the background art.

According to one aspect, there is provided a plasma display apparatus comprising a plasma display panel comprising an electrode, a frame formed over a rear surface area of the plasma display panel, and an integrated circuit for controlling a signal applied to the electrode, wherein the integrated circuit is formed over an edge potion of the frame.

According to another aspect, there is provided a plasma display apparatus comprising a plasma display panel comprising an electrode, a frame formed over a rear surface area of the plasma display panel, and a driving board for applying a signal to the electrode, wherein the driving board is formed over an edge potion of the frame.

According to still another aspect, there is provided a plasma display apparatus comprising a plasma display panel comprising an electrode, a frame formed over a rear surface area of the plasma display panel, a driving board for applying a signal to the electrode, and an integrated circuit for controlling the signal applied to the electrode, wherein the driving board and the integrated circuit are formed over an edge potion of the frame.

BRIEF DESCRIPTION OF THE DRAWINGS

The invention will be described in detail with reference to the following drawings in which like numerals refer to like elements.

DETAILED DESCRIPTION OF PREFERRED EMBODIMENTS

Figure 1:
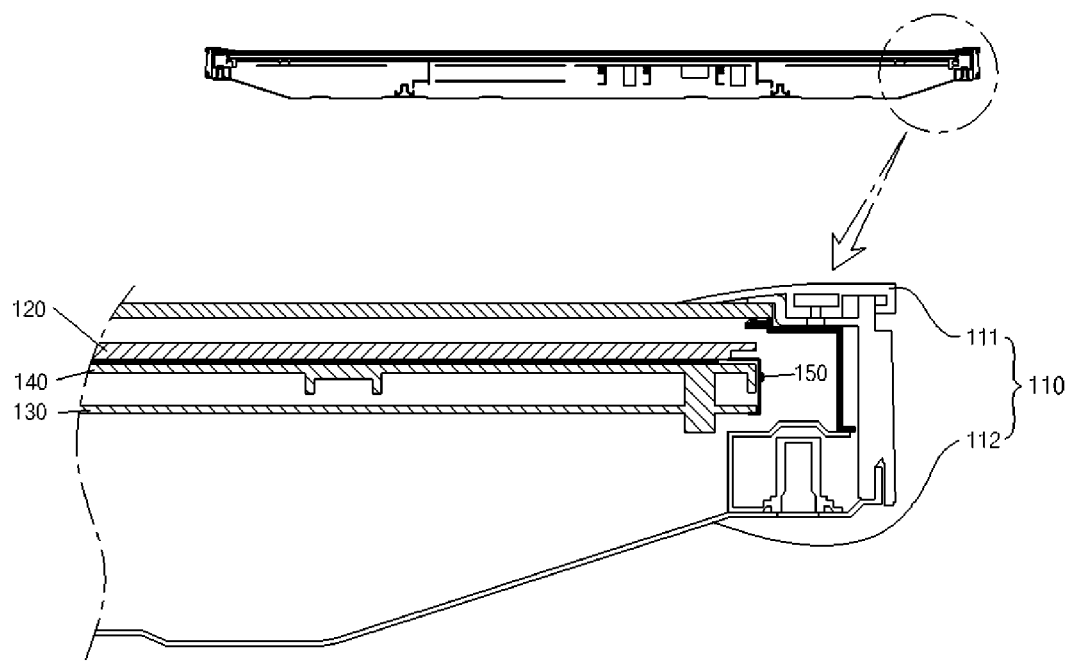
FIG. 1 illustrates a plasma display apparatus according to a first embodiment of the present invention.

Preferred embodiments of the present invention will be described in a more detailed manner with reference to the drawings.

A plasma display apparatus according to embodiments of the present invention comprises a plasma display panel comprising an electrode, a frame formed over a rear surface area of the plasma display panel, and an integrated circuit for controlling a signal applied to the electrode. The integrated circuit is formed over an edge potion of the frame.

It is preferable that the edge potion of the frame comprises a bent frame portion formed by bending the frame to allow the formation of the integrated circuit over the edge portion of the frame.

It is preferable that the bent frame portion is bent in a front direction or a rear direction of the frame.

It is preferable that a heat dissipation sheet is formed on an upper part or a lower part of the integrated circuit.

It is preferable that when the number of integrated circuits is plural, the heat dissipation sheet is individually formed on each of the plurality of integrated circuits.

It is preferable that a heat sink is formed over the integrated circuit.

It is preferable that an auxiliary frame for supporting the integrated circuit is formed over the edge potion of the frame.

It is preferable that a fastening member for fastening the integrated circuit to the frame is formed over the edge potion of the frame.

It is preferable that the electrode comprises at least one of a data electrode, a scan electrode or a sustain electrode.

It is preferable that the integrated circuit is formed on a flexible substrate.

It is preferable that the flexible substrate extends to the edge potion of the frame.

A plasma display apparatus according to the embodiments of the present invention comprises a plasma display panel comprising an electrode, a frame formed over a rear surface area of the plasma display panel, and a driving board for applying a signal to the electrode. The driving board is formed over an edge potion of the frame.

It is preferable that the edge potion of the frame comprises a bent frame potion formed by bending the frame to allow the formation of the driving board over the edge potion of the frame.

It is preferable that the bent frame portion is bent in a front direction or a rear direction of the frame.

It is preferable that a fastening member for fastening the driving board to the frame is formed over the edge potion of the frame.

It is preferable that the electrode comprises at least one of a data electrode, a scan electrode or a sustain electrode.

A plasma display apparatus according to the embodiments of the present invention comprises a plasma display panel comprising an electrode, a frame formed over a rear surface area of the plasma display panel, a driving board for applying a signal to the electrode, and an integrated circuit for controlling the signal applied to the electrode. The driving board and the integrated circuit are formed over an edge potion of the frame.

It is preferable that the edge potion of the frame comprises a bent frame portion formed by bending the frame to allow the formation of the driving board and the integrated circuit over the edge potion of the frame.

It is preferable that the integrated circuit is formed over the driving board.

It is preferable that an auxiliary frame for supporting the integrated circuit is formed over the driving board.

Hereinafter, exemplary embodiments of the present invention will be described in detail with reference to the attached drawings.

First Embodiment

FIG. 1 illustrates a plasma display apparatus according to a first embodiment of the present invention.

As shown in FIG. 1, the plasma display apparatus according to the first embodiment of the present invention comprises a case 110 including a front cabinet 111 and a back cover 112 to decide an outward shape, a plasma display panel 120 for displaying an image, a frame 140 for supporting the plasma display panel 120, and a driving board 130 for driving the plasma display panel 120.

The plasma display apparatus according to the first embodiment of the present invention controls a driving signal which the driving board 130 applies to an electrode of the plasma display panel 120. The plasma display apparatus comprises an integrated circuit (IC) 150 formed over an edge portion of the frame 140. The plasma display apparatus according to the first embodiment of the present invention will be described in detail with reference to FIGS. 2 to 6.

Figure 2:
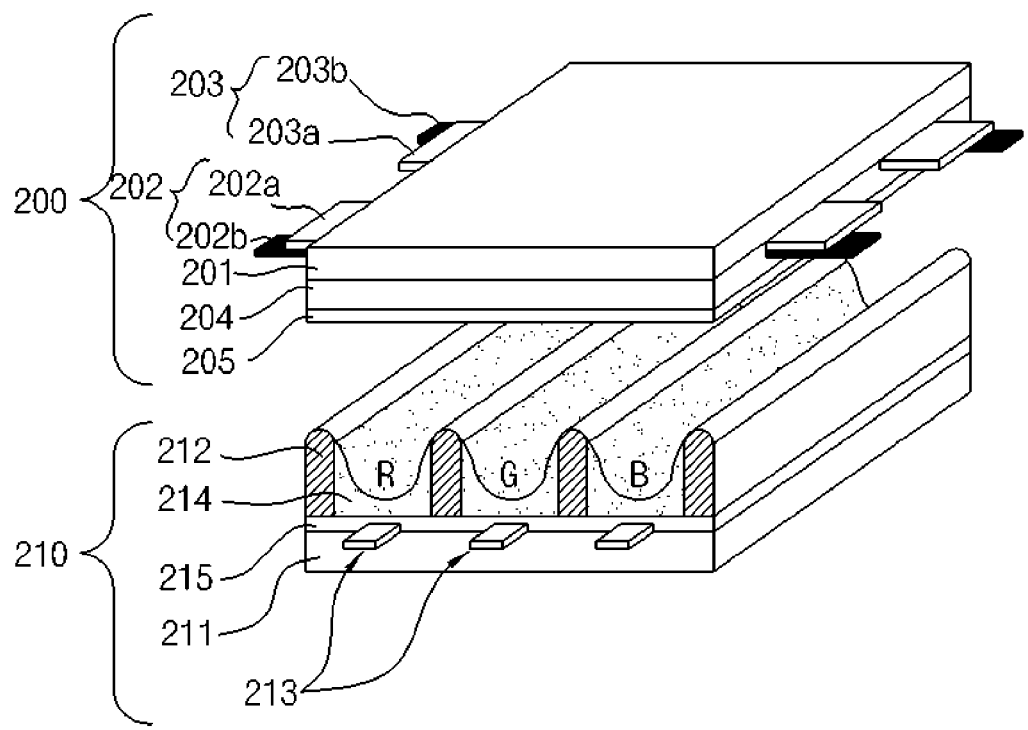
FIG. 2 illustrates a plasma display panel according to the first embodiment of the present invention.

FIG. 2 illustrates a plasma display panel according to the first embodiment of the present invention.

As shown in FIG. 2, the plasma display panel according to the first embodiment of the present invention comprises a front panel 200 and a rear panel 210 which are coalesced in parallel to oppose to each other at a predetermined distance therebetween.

The front panel 200 comprises maintenance electrode pair 202 and 203 which are formed in pairs on a front substrate 201. The maintenance electrode pair 202 and 203 comprises a scan electrode 202 and a sustain electrode 203 depending on their function. The maintenance electrode pair 202 and 203 each comprise transparent electrodes 202a and 203a made of a transparent indium-tin-oxide (ITO) material and bus electrodes 202b and 203b. The maintenance electrode pair 202 and 203 are covered with an upper dielectric layer 204 for limiting a discharge current and providing insulation between the maintenance electrode pairs 202 and 203. A protective layer 205 with a deposit of MgO is formed on an upper surface of the upper dielectric layer 204 to facilitate discharge conditions.

A plurality of barrier ribs 212 are formed on a rear substrate 211 of the rear panel 210 to form a plurality of discharge spaces, that is, a plurality of discharge cells. A plurality of data electrodes 213 for generating vacuum ultraviolet rays by the performance of an address discharge are formed to intersect the maintenance electrode pair 202 and 203. Red (R), green (G) and blue (B) phosphors 214 are coated on the rear panel 210 to emit visible light for displaying an image during the generation of the address discharge. A lower dielectric layer 215 for protecting the data electrodes 213 is formed between the data electrodes 213 and the phosphors 214.

A structure of the plasma display panel of the present invention is not limited to a structure of the plasma display panel of FIG. 2. The structure of the plasma display panel of the present invention may be changed, if necessary. For example, the barrier rib is an open type, in which adjacent discharge cells are open each other, or a close type, in which adjacent discharge cells are close each other. Further, the maintenance electrode pair comprise the transparent electrodes 202a and 203a and the bus electrodes 202b and 203b in FIG. 2. However, the maintenance electrode pair may have an ITO-less electrode structure comprising only the bus electrodes.

Figure 3:
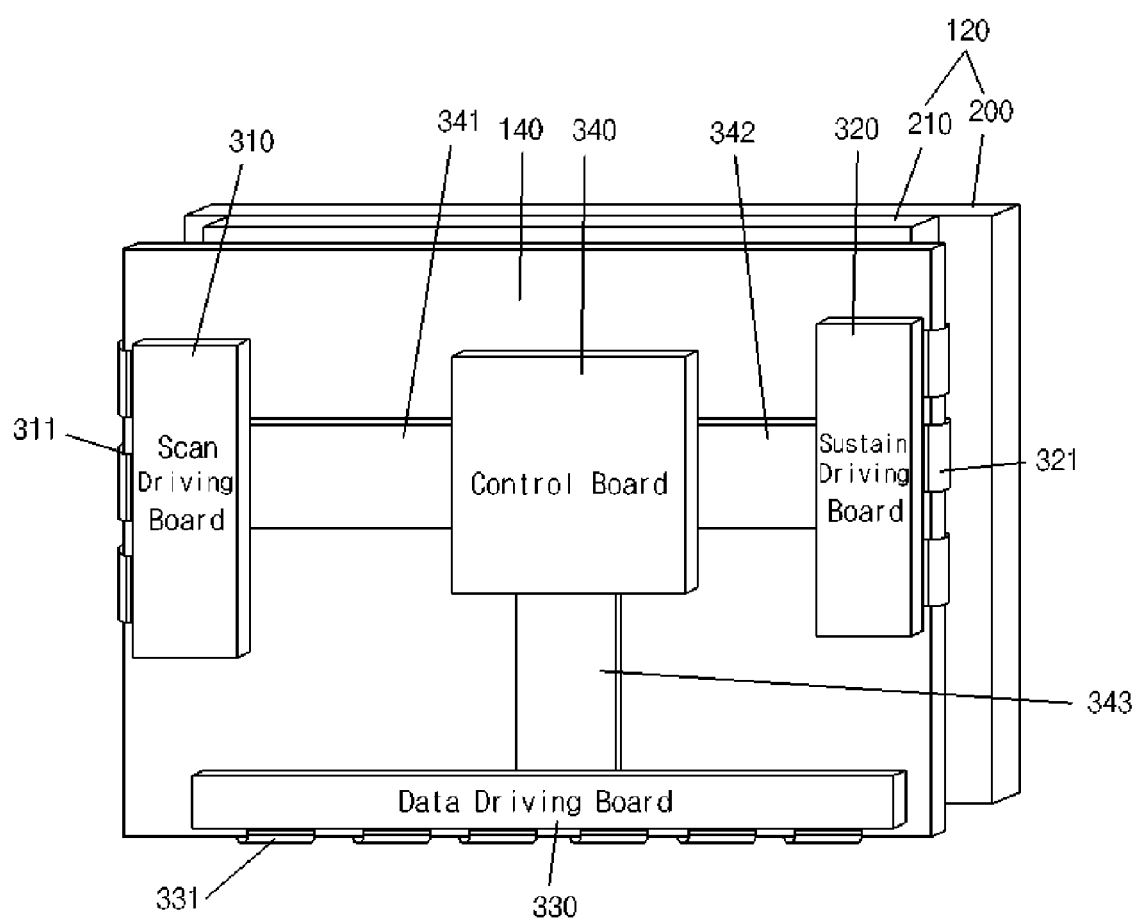
FIG. 3 illustrates a driving board according to the first embodiment of the present invention.

FIG. 3 illustrates a driving board according to the first embodiment of the present invention.

As shown in FIG. 3, a scan driving board 310, a sustain driving board 320, a data driving board 330, a controller board 340, and a power source board (not shown) are formed over the frame 140 of the plasma display apparatus according to the first embodiment of the present invention.

The scan driving board 310 applies a scan driving signal to the scan electrode of the plasma display panel 120 comprising the front panel 200 and the rear panel 210. The scan driving signal is applied through a flexible substrate 311 being a connecting member for connecting the scan driving board 310 to the scan electrode of the plasma display panel 120.

The sustain driving board 320 applies a sustain driving signal to the sustain electrode of the plasma display panel 120. The sustain driving signal is applied through a flexible substrate 321 being a connecting member for connecting the sustain driving board 320 to the sustain electrode of the plasma display panel 120.

The data driving board 330 applies a data driving signal to the data electrode of the plasma display panel 120. The data driving signal is applied through a flexible substrate 331 being a connecting member for connecting the data driving board 330 to the data electrode of the plasma display panel 120.

The plasma display apparatus according to the first embodiment of the present invention comprises the integrated circuit for controlling the driving signal applied to at least one of the data electrode, the scan electrode or the sustain electrode of the plasma display panel 120. The integrated circuit is located over the edge portion of the frame 140 and is formed on the flexible substrate for connecting the driving board to the electrode. The integrated circuit formed on the flexible substrate is a chip-on-film (COF) or a tape carrier package (TCP). Next, an explanation will be given of an example of the integrated circuit for controlling the data driving signal with reference to FIGS. 4 and 6.

The controller board 340 generates a signal for displaying an image using an image signal input from the outside. For example, the controller board 340 generates a timing control signal for controlling operation timing of each of the scan driving board 310, the sustain driving board 320 and the data driving board 330. The controller board 340 supplies a scan timing control signal to the scan driving board 310 through a first cable 341. The controller board 340 supplies a sustain timing control signal to the sustain driving board 320 through a second cable 342. The controller board 340 supplies a data timing control signal to the data driving board 330 through a third cable 343.

The power source board supplies a power source to each of the boards 310, 320, 330 and 340.

Figure 4:
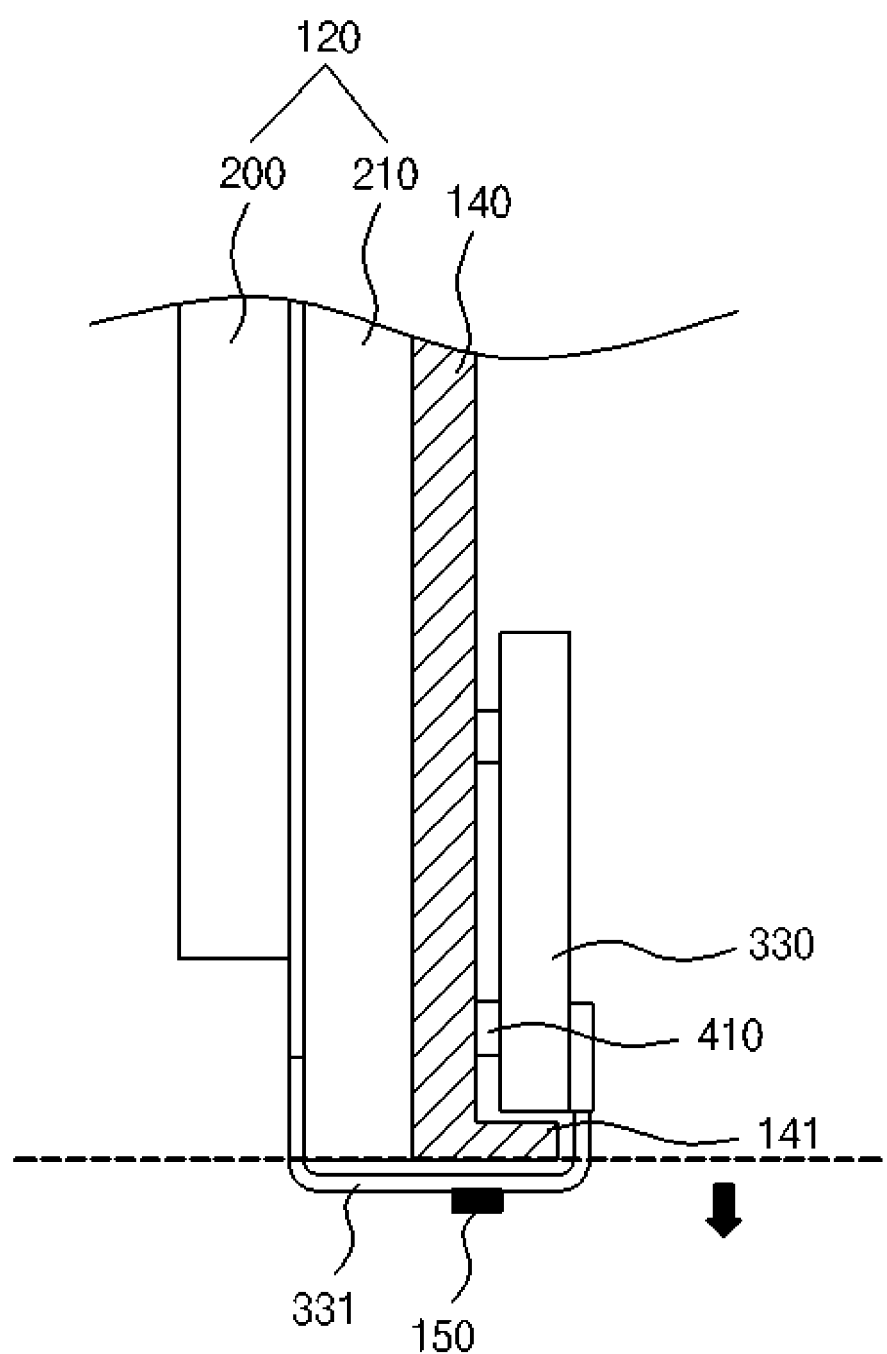
FIG. 4 illustrates a structure of the plasma display apparatus according to the first embodiment of the present invention.

FIG. 4 illustrates a structure of the plasma display apparatus according to the first embodiment of the present invention.

As shown in FIG. 4, the frame 140 is formed over a rear surface area of the plasma display panel 120. A fastening member 410 fastens the data driving board 330 formed over the rear surface area of the frame 140 to the frame 140. The flexible substrate 331 connects the data electrode of the plasma display panel 120 to the data driving board 330. The integrated circuit 150 is formed over the edge portion of the frame 140. In the present invention, a meaning of "over the edge portion of the frame" is a bottom region of dotted lines illustrated in FIG. 4, where the frame 140 is not formed, as indicated by an arrow in FIG. 4.

The frame 140 supports the plasma display panel 120 comprising the front panel 200 and the rear panel 210. Further, the frame 140 emits a heat generated in the plasma display panel 120 or the driving boards when driving the plasma display apparatus, to the outside.

The edge portion of the frame 140 according to the first embodiment of the present invention comprises a bent frame portion 141 formed by bending the frame 140 to allow the formation of the integrated circuit 150 over the edge portion of the frame 140. In FIG. 4, the bent frame portion 141 is bent in a rear direction of the frame 140. However, the bent frame portion 141 may be bent in a front direction of the frame 140. In other words, the bent frame portion 141 of the frame 140 according to the first embodiment of the present invention may be bent in any direction of the frame or at any bending angle to the frame, if necessary. The bent frame portion 141 of the frame 140 allows the formation of the integrated circuit 150 over the edge portion of the frame 140. Thus, in another structure of the frame 140 according to the first embodiment of the present invention, the edge portion of the frame 140 may not comprise the bent frame portion 141. Instead, the edge portion of the frame 140 may comprise a separate auxiliary frame such that the integrated circuit 150 may be formed over the auxiliary frame.

The integrated circuit 150 controls the data driving signal applied from the data driving board 330 to supply the data driving signal to the data electrode. Since the integrated circuit 150 performs a high-speed switching operation for controlling the driving signal when driving the plasma display apparatus, much heat is generated in the integrated circuit 150. Thus, the plasma display apparatus requires a heat dissipating member for preventing a damage of the integrated circuit 150 by an intense heat. The integrated circuit 150 is easily damaged by an external impact. Thus, the plasma display apparatus requires a protective member for preventing a damage of the integrated circuit 150 caused by an external impact. Further, the integrated circuit 150 is formed on the flexible substrate for electrically connecting the electrodes of the plasma display panel to the driving boards, thereby controlling the driving signal.

The above characteristics of the integrated circuit are importantly considered in the design of the structure of the plasma display apparatus. For example, when the integrated circuit is formed over the rear surface area of the frame, the protective member and the heat dissipation member are successively stacked on the integrated circuit. Thus, the depth of the plasma display apparatus and the length of the flexible substrate increase, and the increase results in an increase in the manufacturing cost of the plasma display apparatus.

In the first embodiment of the present invention, the integrated circuit is formed over the edge portion of the frame in consideration of the above problem.

Figure 5:
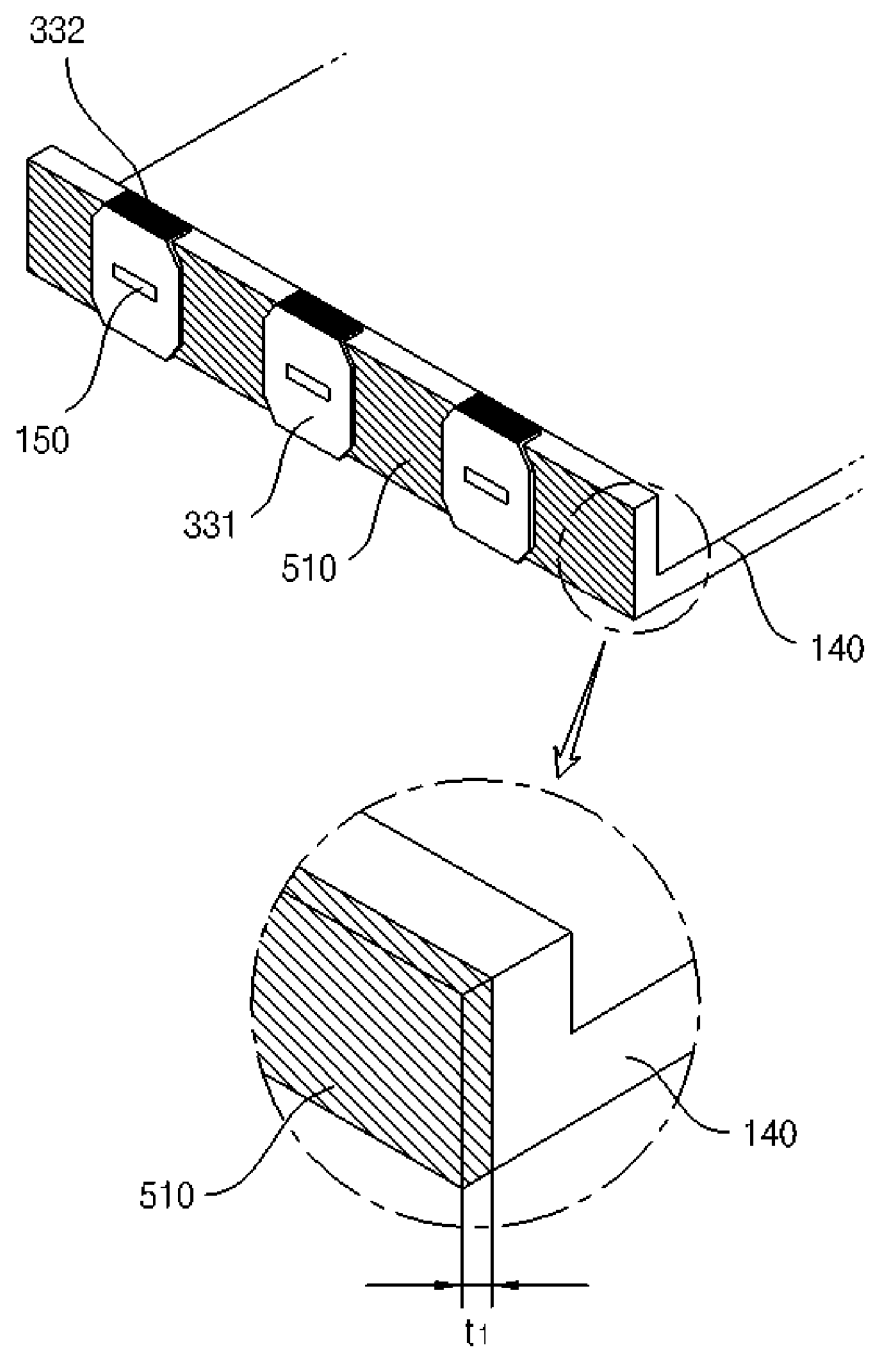
FIG. 5 illustrates another structure of the plasma display apparatus according to the first embodiment of the present invention.

FIG. 5 illustrates another structure of the plasma display apparatus according to the first embodiment of the present invention.

As shown in FIG. 5, the plasma display apparatus comprises the plurality of integrated circuits 150. This reason is that pins of one integrated circuit connected to the data electrodes is limited in number. As the plasma display apparatus becomes larger and supports high definition, the number of integrated circuits increases.

Since the integrated circuit 150 is located over the edge portion of the frame 140 in the first embodiment of the present invention, the flexible substrate 331, on which the integrated circuit 150 is formed, extends to the edge portion of the frame 140. That is, since the flexible substrate 331 does not need to extend to the rear surface area of the frame 140 in the first embodiment of the present invention, the manufacturing cost of the plasma display apparatus decreases. The flexible substrate 331 comprises an electrode pattern exposing portion 332 for connecting the driving boards to the electrode of the plasma display panel.

The plasma display apparatus according to the first embodiment of the present invention comprises a heat dissipation sheet 510 formed on an upper part or a lower part of the integrated circuit 150 over formed the edge portion of the frame 140.

The heat generated in the integrated circuit 150 is conducted to the heat dissipation sheet 510, and then the heat dissipation sheet 510 emits the heat to the outside. Since the heat dissipation sheet 510 is formed directly on the integrated circuit 150, the heat dissipation sheet 510 protects the integrated circuit 150 from an external physical impact. As the heat dissipation sheet 510, a double sided tape or a silicon, and the like, is used. It is preferable that a thickness $t_1$ of the heat dissipation sheet 510 ranges from 0.5 mm to 5 mm in consideration of the efficiency of heat dissipation, absorptivity of the external impact and the manufacturing cost.

In the first embodiment of the present invention, the heat dissipation sheet 510 is formed in the form of one sheet extending along the edge portion of the frame. However, the heat dissipation sheet may be formed on a portion of the frame, over which each of the integrated circuits is formed, for the purpose of reducing the manufacturing cost.

Figure 6:
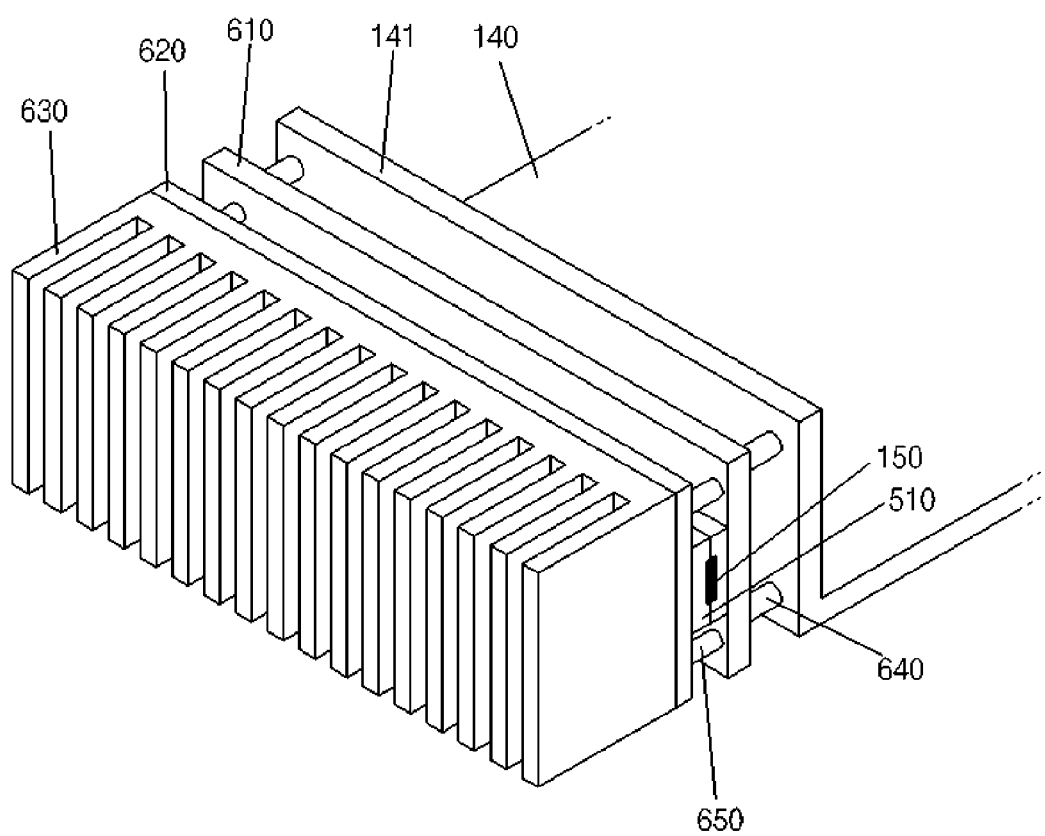
FIG. 6 illustrates another structure of the plasma display apparatus according to the first embodiment of the present invention.

FIG. 6 illustrates another structure of the plasma display apparatus according to the first embodiment of the present invention.

As shown in FIG. 6, the plasma display apparatus according to the first embodiment of the present invention comprises the frame 140, a first auxiliary frame 610, the integrated circuit 150, a second auxiliary frame 620, the heat dissipation sheet 510, a heat sink 630, a first fastening member 640, and a second fastening member 650.

The frame 140 emits the heat generated in the plasma display panel and the driving boards, and supports the plasma display panel.

The first auxiliary frame 610 is formed over the bent frame portion 141 of the frame 140, and supports the integrated circuit 150. Further, the heat generated in the integrated circuit 150 is conducted to the first auxiliary frame 610, and then the first auxiliary frame 610 emits the heat toward the frame 140. The heat emitted toward the frame 140 is conducted to the frame 140 through the first fastening member 640, and then is convected in a space between the frame 140 and the first auxiliary frame 610. A structure of the first auxiliary frame 610 may be variously changed to optimize the location of the integrated circuit 150 over the edge portion of the frame 140, to increase the efficiency of the heat dissipation, and to stably support the integrated circuit 150.

The first fastening member 640 supports the first auxiliary frame 610. The plurality of first fastening members 640 are formed to fasten the first auxiliary frame 610 to the frame 140.

The integrated circuit 150 is formed over the first auxiliary frame 610. The flexible substrate is not shown in FIG. 6 for the purpose of clearly showing other members.

The second auxiliary frame 620 is formed over the integrated circuit 150. The second auxiliary frame 620 conducts the heat generated in the integrated circuit 150 to the heat sink 630. Further, since the second auxiliary frame 620 is separated from the first auxiliary frame 610 by a predetermined distance, a space for forming the integrated circuit 150 is provided between the first auxiliary frame 610 and the second auxiliary frame 620.

The second fastening member 650 fastens the first auxiliary frame 610 to the second auxiliary frame 620, and also forms a space between the first auxiliary frame 610 and the second auxiliary frame 620. As the first or second fastening member 640 or 650, a pin, a screw, a rivet, and the like, are substantially used. The first or second fastening member 640 or 650 may be used to directly fasten the integrated circuit 150 to the frame 140.

The heat dissipation sheet 510 winds the integrated circuit 150 between the first auxiliary frame 610 and the second auxiliary frame 620. The heat dissipation sheet 510 absorbs an external impact and conducts the heat generated in the integrated circuit 150 to the first auxiliary frame 610 and the second auxiliary frame 620.

The heat sink 630 transfers the heat conducted from the second auxiliary frame 620 to a heat dissipation pin of the heat sink 630 through a body of the heat sink 630. Then, the heat sink 630 emits the heat to the outside through the heat dissipation pin with a large area.

As described above, according to the first embodiment of the present invention, since the heat dissipation member and the protective member for preventing the damage of the integrated circuit are stacked on the edge portion of the frame, an increase in the thickness of the plasma display apparatus is prevented.

Second Embodiment

Figure 7:
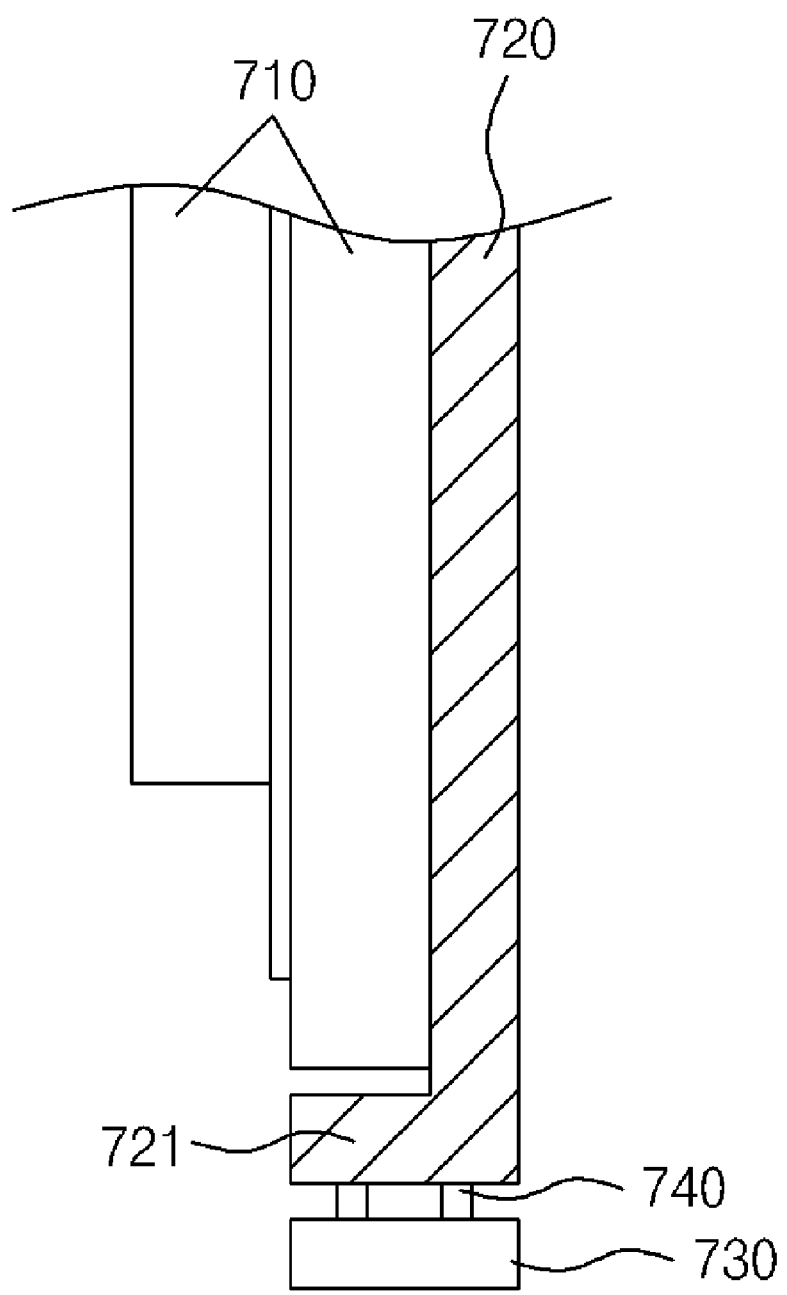
FIG. 7 illustrates a structure of a plasma display apparatus according to a second embodiment of the present invention.

FIG. 7 illustrates a structure of a plasma display apparatus according to a second embodiment of the present invention.

As shown in FIG. 7, the plasma display apparatus according to the second embodiment of the present invention comprises a plasma display panel 710, a frame 720 and a driving board 730. Since structures and components of the plasma display apparatus according to the second embodiment of the present invention substantially identical or equivalent to those of the plasma display apparatus according to the first embodiment of the present invention are fully described in FIGS. 1 to 6, the description thereabout is omitted.

The frame 720 is formed over a rear surface area of the plasma display panel 710. A fastening member 740 fastens the driving board 730 formed over an edge portion of the frame 720 to the frame 720.

The edge portion of the frame 720 according to the second embodiment of the present invention comprises a bent frame portion 721 formed by bending the frame 720 to allow the formation of the driving board 730 over the edge portion of the frame 720. The bent frame portion 721 is bent in a front direction or a rear direction of the frame 720. Thus, in another structure of the frame 720 according to the second embodiment of the present invention, the edge portion of the frame 720 may not comprise the bent frame portion 721. Instead, the edge portion of the frame 720 may comprise a separate auxiliary frame such that the driving board 730 may be formed over the auxiliary frame.

The driving board 730 formed over the edge portion of the frame 720 may comprise at least one of a scan driving board, a sustain driving board or a data driving board.

As described above, according to the second embodiment of the present invention, since the driving board is formed over the edge portion of the frame, the thickness of the plasma display apparatus effectively decreases.

Third Embodiment

Figure 8:
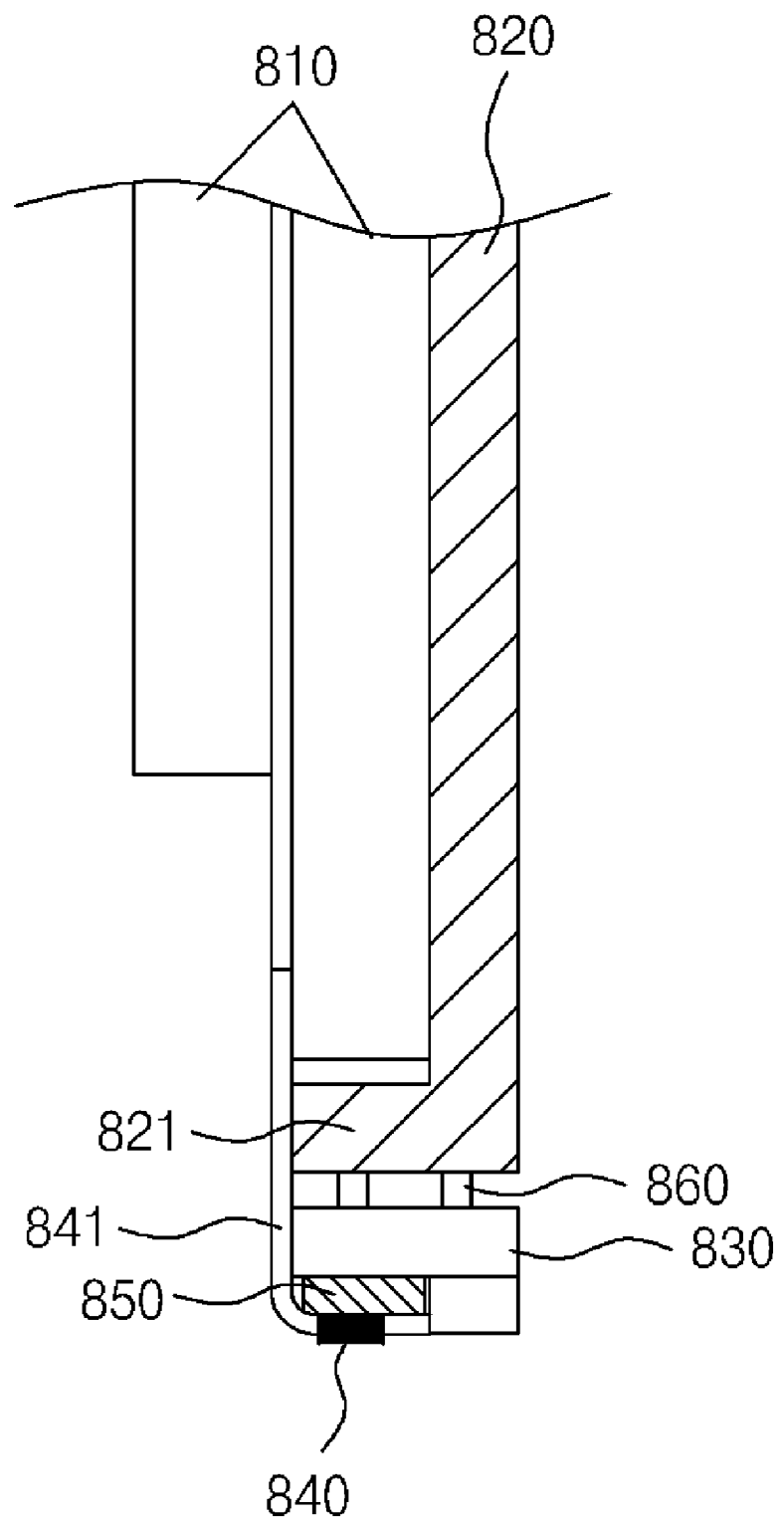
FIG. 8 illustrates a structure of a plasma display apparatus according to a third embodiment of the present invention.

FIG. 8 illustrates a structure of a plasma display apparatus according to a third embodiment of the present invention.

As shown in FIG. 8, the plasma display apparatus according to the third embodiment of the present invention comprises a plasma display panel 810, a frame 820, a driving board 830, an integrated circuit 840 and an auxiliary frame 850. Since structures and components of the plasma display apparatus according to the third embodiment of the present invention substantially identical or equivalent to those of the plasma display apparatus according to the first and second embodiments of the present invention are fully described in FIGS. 1 to 7, the description thereabout is omitted.

The frame 820 is formed over a rear surface area of the plasma display panel 810. A fastening member 860 fastens the driving board 830 to a bent frame portion 821 formed by bending an edge portion of the frame 820. Further, the integrated circuit 840 is formed over the driving board 830. The plasma display apparatus according to the third embodiment of the present invention comprises an auxiliary frame 850 which is formed on the driving board 830 and supports the integrated circuit 840. The auxiliary frame 850 supports the integrated circuit 840, and also emits a heat generated in the integrated circuit 840 to the outside.

As described above, according to the third embodiment of the present invention, since the driving board 830 and the integrated circuit 840 are formed over the edge portion of the frame 820, the plasma display apparatus is manufactured to be thin and light. Since a flexible substrate 841 for connecting the plasma display panel 810 to the driving board 830 does not need to extend to the rear surface area of the frame 820, the length of the flexible substrate 841 decreases. Thus, the manufacturing cost of the plasma display apparatus decreases.

The invention being thus described will be obvious that the same may be varied in many ways. Such variations are not to be regarded as a departure from the spirit and scope of the invention, and all such modifications as would be obvious to one skilled in the art are intended to be included within the scope of the following claims.

What is claimed is:
1. A plasma display apparatus comprising:
   a plasma display panel comprising an electrode;
   a frame positioned over a rear surface area of the plasma display panel and having an edge portion that extends in a plane that is substantially normal to the rear surface area of the plasma display panel, the edge portion is positioned over an edge of the plasma display panel;

a driving board configured to apply a signal to the electrode, the driving board being secured to the edge portion of the frame;

an auxiliary frame coupled to the driving board, the auxiliary frame being positioned over the edge of the plasma display panel;

an integrated circuit for controlling configured to control the signal applied to the electrode, the integrated circuit being coupled to the auxiliary frame; and a fastening member configured to fasten the driving board to the edge portion of the frame to facilitate positioning of the driving board and the integrated circuit over the edge portion of the frame, wherein the integrated circuit is positioned over the driving board, wherein the driving board is positioned between the auxiliary frame and the plasma display panel, wherein the auxiliary frame is positioned between the integrated circuit and the driving board, wherein the fastening member is positioned between the driving board and the edge portion of the frame, and wherein the driving board is separated from the edge portion of the frame by the fastening member.

2. The plasma display apparatus of claim 1, further comprising:

a second heat dissipation sheet attached to a first heat dissipation sheet and the integrated circuit.

3. The plasma display apparatus of claim 2, further comprising:

a heat sink secured to the auxiliary frame.

4. The plasma display apparatus of claim 1, further comprising a flexible substrate configured to connect the plasma display panel to the driving board and positioned to not extend to a rear surface of the frame.

5. A display apparatus comprising:

a display panel comprising a electrode;

a frame positioned over a rear surface area of the display panel and having an edge portion that extends in a plane that is substantially normal to the rear surface area of the display panel, the edge portion is positioned over an edge of the display panel;

a driving board configured to apply a signal to the electrode, the driving board being secured to the edge portion of the frame;

an auxiliary frame coupled to the driving board, the auxiliary frame being positioned over the edge of the display panel;

an integrated circuit configured to control the signal applied to the electrode, the integrated circuit being coupled to the auxiliary frame; and a fastening member configured to fasten the driving board to the edge portion of the frame to facilitate positioning of the driving board and the integrated circuit over the edge portion of the frame, wherein the integrated circuit is positioned over the driving board, wherein the driving board is positioned between the auxiliary frame and the display panel, wherein the auxiliary frame is positioned between the integrated circuit and the driving board, wherein the fastening member is positioned between the driving board and the edge portion of the frame, and wherein the driving board is separated from the edge portion of the frame by the fastening member.

6. The display apparatus of claim 5, further comprising a second heat dissipation sheet attached to a first heat dissipation sheet and the integrated circuit.

7. The display apparatus of claim 6, further comprising a heat sink secured to the auxiliary frame.

8. The display apparatus of claim 5, further comprising a flexible substrate configured to connect the display panel to the driving board and positioned to not extend to a rear surface of the frame.

* * * * *